United States Patent
Otero-De-Leon et al.

(10) Patent No.: US 11,916,375 B2
(45) Date of Patent: Feb. 27, 2024

(54) FAULT CURRENT LIMITER FOR ENERGY STORAGE SYSTEMS

(71) Applicant: PowerSecure, Inc., Wake Forest, NC (US)

(72) Inventors: Ruben Otero-De-Leon, Raleigh, NC (US); Joaquin Aguerre, Raleigh, NC (US); Bryan Daniels, Willow Springs, NC (US); Marshall Worth, Raleigh, NC (US)

(73) Assignee: PowerSecure, Inc., Durham, NC (US)

( * ) Notice: Subject to any disclaimer, the term of this patent is extended or adjusted under 35 U.S.C. 154(b) by 185 days.

(21) Appl. No.: 16/688,167

(22) Filed: Nov. 19, 2019

(65) Prior Publication Data

US 2020/0161853 A1 May 21, 2020

Related U.S. Application Data

(60) Provisional application No. 62/769,554, filed on Nov. 19, 2018.

(51) Int. Cl.
*H02H 9/02* (2006.01)
*G01R 33/07* (2006.01)

(52) U.S. Cl.
CPC .............. *H02H 9/025* (2013.01); *G01R 33/07* (2013.01)

(58) Field of Classification Search
CPC .............................. G01R 15/20; G01R 15/202; G01R 19/16571; G01R 33/07; G01R 33/072; H02H 1/0015; H02H 3/08; H02H 3/087; H02H 3/16; H02H 3/20; H02H 3/207; H02H 3/22; H02H 3/24; H02H 3/42; H02H 3/44; H02H 3/46; H02H 3/50; H02H 7/18; H02H 7/268; H02H 7/28; H02H 7/30; H02H 9/025; H02M 2001/0009; H02M 3/156; H02M 3/158; H03K 17/0822;

(Continued)

(56) References Cited

U.S. PATENT DOCUMENTS

| | | | |
|---|---|---|---|
| 5,563,479 A * | 10/1996 | Suzuki | B60L 50/60 388/811 |
| 10,020,650 B2 * | 7/2018 | Roesner | H02J 7/00306 |
| 10,770,887 B2 * | 9/2020 | Nojima | H03K 17/72 |

(Continued)

FOREIGN PATENT DOCUMENTS

EP 4075618 A1 * 10/2022

*Primary Examiner* — Jared Fureman
*Assistant Examiner* — Nicolas Bellido
(74) *Attorney, Agent, or Firm* — FisherBroyles LLP; Kevin D. Jablonski

(57) ABSTRACT

A fault-current limiting device having an input voltage node configured to receive a first voltage signal from an energy source, such as a battery, and an input reference node configured to receive a reference signal from the energy source. The device further includes a first switch coupled between the input voltage node and an output voltage node and a second switch coupled between the input reference node and an output reference node. The device further includes a current sensor circuit coupled to the output voltage node and coupled respectively to the first switch and the second switch wherein the current sensor circuit is configured to open the first and second switches in response to sensing a current signal at the output voltage node that exceeds a threshold current (e.g., a transient fault current).

19 Claims, 2 Drawing Sheets

(58) Field of Classification Search
CPC ...... H03K 17/567; H03K 17/60; H03K 17/72; H03K 17/90
See application file for complete search history.

(56) References Cited

U.S. PATENT DOCUMENTS

| | | | |
|---|---|---|---|
| 11,322,926 B2* | 5/2022 | Niehoff | H01H 9/548 |
| 2010/0164446 A1* | 7/2010 | Matsuo | H02M 3/158 |
| | | | 323/282 |
| 2012/0139514 A1* | 6/2012 | Paatero | H02M 3/156 |
| | | | 323/282 |
| 2012/0235661 A1* | 9/2012 | Roessler | H02H 3/087 |
| | | | 323/284 |
| 2014/0009134 A1* | 1/2014 | Bernardon | H02M 3/156 |
| | | | 323/284 |
| 2015/0377929 A1* | 12/2015 | Wang | H01F 27/2804 |
| | | | 324/117 R |
| 2016/0359311 A1* | 12/2016 | Handy | H02H 3/025 |
| 2018/0076612 A1* | 3/2018 | Lavertu | H02H 3/10 |
| 2019/0334340 A1* | 10/2019 | Niehoff | H01H 33/596 |
| 2020/0072876 A1* | 3/2020 | Kawasaki | G01R 33/091 |
| 2020/0366086 A1* | 11/2020 | Dent | H02H 9/005 |
| 2021/0194235 A1* | 6/2021 | Koga | G01R 31/16 |

* cited by examiner

FAULT CURRENT LIMITER FOR ENERGY STORAGE SYSTEMS

PRIORITY CLAIM TO PROVISIONAL PATENT APPLICATION

This patent application is related to and claims priority of filing date from the patent application entitled 'FAULT CURRENT LIMITER FOR ENERGY STORAGE SYSTEMS' filed on Nov. 19, 2018 and allocated application No. 62/769,554, which is hereby incorporated by reference in its entirety.

BACKGROUND

Energy storage systems, whether DC systems such as battery stacks, battery clusters, or AC systems such as an electrical grid, are prevalently being used to store energy produced at one time for use at a later time. A device, such as a battery, that stores energy is sometimes called an accumulator. Accumulators are typically used in alternatively energy production systems, such as solar energy farms and wind farms, as energy may be sporadically produced at non-peak times, but not needed until a later peak-use time. Thus, the means of producing the energy may be coupled to an accumulator, such as a battery stack, for use at some later time In turn, the battery stack may also be coupled to an electrical grid or other energy load whereby energy is transferred from the stored battery to use on the electrical grid or energy load. Typically, various battery stacks in a battery farm may be switched in and out to meet demand. Thus, a group of battery stacks in a battery farm can scale up and down to meet demand. One problem with switching battery stacks in and out of connection to the electrical grid is the presence of transients and switching currents that can become exceedingly large. This is a function of the low impedance of the electrical grid/load and the high energy density of the battery stacks. As a result, transient fault currents may become large at the moment of switching in a battery stack which may cause false trips in over-current protection circuitry of the electrical grid/load. Early transient-current detection and fault-current interruption at the local battery stack would be a more efficient and a more scalable solution to handling large fault currents that are generated during stack switching where numerous energy sources are switched in and out together.

BRIEF DESCRIPTION OF THE DRAWINGS

Aspects and many of the attendant advantages of the claims will become more readily appreciated as the same become better understood by reference to the following detailed description, when taken in conjunction with the accompanying drawings, wherein:

DETAILED DESCRIPTION

The following discussion is presented to enable a person skilled in the art to make and use the subject matter disclosed herein. The general principles described herein may be applied to embodiments and applications other than those detailed above without departing from the spirit and scope of the present detailed description. The present disclosure is not intended to be limited to the embodiments shown but is to be accorded the widest scope consistent with the principles and features disclosed or suggested herein.

By way of an overview, the subject matter disclosed herein may be directed to an interruption circuit for an energy storage system. In an embodiment, the interruption mechanism includes one switch in either the positive or negative voltage rail and it may or may not include second switch in the remaining voltage rail. Each switch may be a solid-state electronic device such as an insulated gate bipolar transistor (IGBT). Each IGBT may be further controlled by a circuit using a current sensor to detect excessive currents, such as a Hall effect sensor. In this manner, the fast-switching nature of the IGBT switches off each voltage rail providing the necessary speed for interrupting the connection between an energy source, such as a battery stack, and the load.

In an embodiment, a fault-current limiting device includes an input voltage node configured to receive a first voltage signal from an energy source, such as a battery and an input reference node configured to receive a reference signal from the energy source. The device further includes a first switch coupled between the input voltage node and an output voltage node and a second switch coupled between the input reference node and an output reference node. The device further includes a current sensor circuit coupled to the output voltage node and coupled respectively to the first switch and the second switch wherein the current sensor circuit is configured to open the first and second switches in response to sensing a current signal at the output voltage node that exceeds a threshold current (e.g., a transient fault current). These and other aspects and advantages will be discussed below with respect to FIGS. 1-4.

Figure 1:
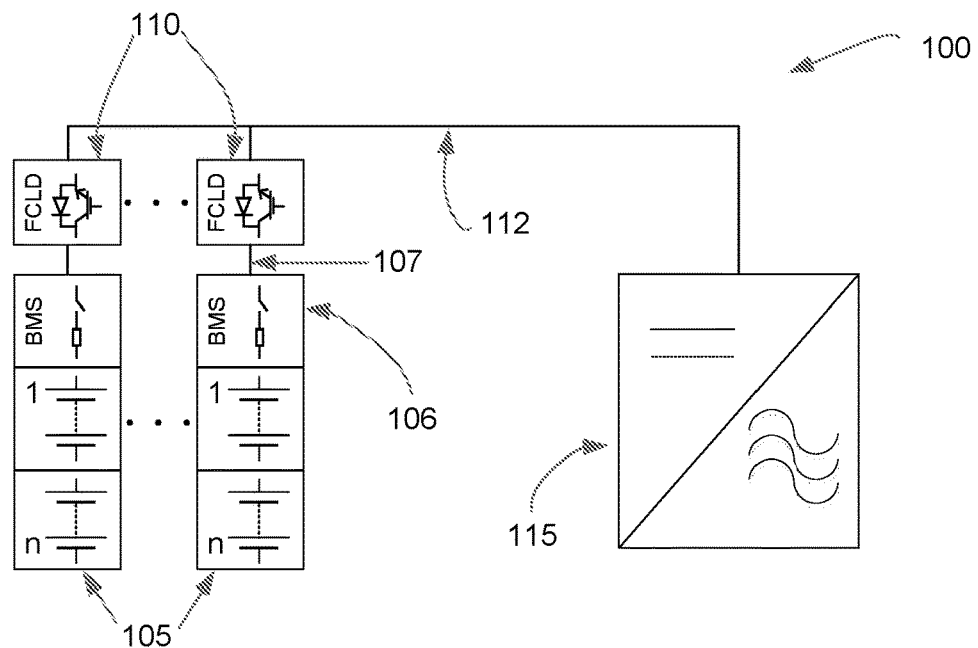
FIG. 1 is a block diagram of an energy storage system according to an embodiment of the subject matter disclosed herein.

FIG. 1 is a block diagram of an energy storage system 100 according to an embodiment of the subject matter disclosed herein. The system 100 includes a plurality of energy sources designed to store electrical energy that may have been generated from a local generation source, such as a wind or solar farm. The energy source may typically be individual batteries or battery stacks 105. Each battery stack 105 may include discrete batteries that work in conjunction with each other to store electrical energy when being charged from an energy generation source (not shown). Each battery stack typically includes a Battery Management System (BMS) that collects the battery data and includes short-circuit protection circuit having a manual disconnect capability for maintenance and/or replacement of each entire battery stack 105.

As shown in FIG. 1, each battery stack 105 may include individual batteries 1-$n$. Each of the individual batteries 1-$n$ may be serviced by a single BMS circuit 106 such that data is collected for each battery 1-$n$ within each battery stack. Further, the disconnect capability of each BMS circuit 106 disconnects each battery 1-$n$ within each respective battery stack 105 when disengaged. Further, each BMS circuit for the respective batteries 1-$n$ in each battery stack 105 is coupled (via connection 107, which comprises a voltage rail and reference rail not individually shown in FIG. 1) to a respective Fault Current Limiting Device (FCLD) 110. In turn, each FCLD 110 is coupled ((via connection 112, which also comprises a voltage rail and reference rail not individually shown in FIG. 1) to a Power Conversion System (PCS) 115.

As is typical, the PCS 115 may be an inverter device capable of inverting DC power from the battery stacks 105 to AC power for use on the electrical grid or at a load. In other embodiments, the PCS 115 may be a transformer that changes the voltage level of the power form the battery stacks for use downstream at a different voltage level beyond the PCS 115. The PCS 115 may feed any electrical grid or electrical load including an AC load or DC load. In the embodiment shown in FIG. 1, the PCS 115 is depicted as a single stage AC/DC converter, whereas in other embodiments, the PCS 115 may be a multiple-stage converter including both DC/DC converters and DC/AC converters.

In the embodiment shown in FIG. 1, there are respective FCLDs 110 shown coupled to (via respective connections 107) respective battery stacks 105. In other embodiments, a different ratio of FCLDs 110 to battery stacks 105 may be realized. For example, in another embodiment, a ratio of two to one may be realized whereby each FCLD 110 may coupled to two respective battery stacks 105. In still further embodiments, the ratio may be ten to one.

Having a scalable FCLD 110 system allows for high transient currents to be dealt with at each respective battery stack 105 prior to causing interruptions and trips at and beyond the PCS 115. That is, relatively short, yet exceedingly large transient currents generated as a result of switching an entire battery stack 105 into service can be detected and limited (as will be discussed below with respect to FIGS. 2-4) at the respective battery stacks 105 without causing large transient currents to the connected load or electrical grid. Therefore, unnecessary trips and faults at the electrical grid (at electrical grid fault protection circuitry not shown) may be avoided which cause delay and interruption to loads and customers beyond those utilizing energy from the connected battery stacks 105.

Figure 2:
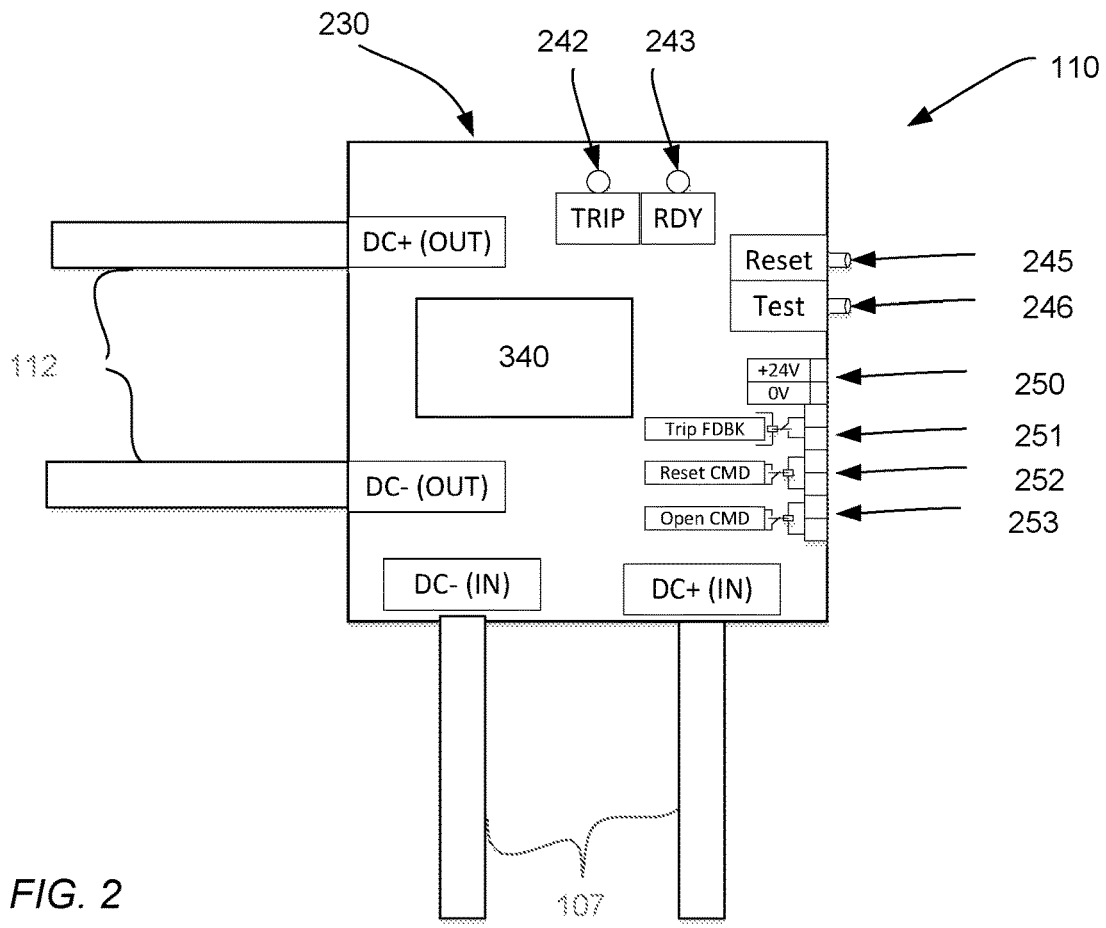
FIG. 2 is a concept drawing of a fault current limiting device according to an embodiment of the subject matter disclosed herein.

FIG. 2 is a concept drawing of an FCLD 230 according to an embodiment of the subject matter disclosed herein. In FIG. 2, the FCLD 230 is depicted as an application specific integrated circuit (ASIC) 230 having integrated pads for externals connections to associated busses, inputs, and indicators. In other embodiments, the depicted FCLD 230 may also be a printed circuit board (PCB) serving similar functionality as next described. As these, aspects and functionality are realized through an ASIC or PCB, the various electronic systems and devices discussed are typically solid-state devices.

Within the various functions provided by the FCLD 110, a short-circuit current detection system 340 may be realized with solid-state circuitry discussed below with respect to FIG. 3. In this embodiment, the short-circuit detection system 340 is constantly monitoring current between the connection 107 and connection 112. Connection 107 comprises a voltage level node or rail (labeled as DC+(IN)) and a reference node or rail (labeled as DC-(IN)) that may be coupled to a battery stack (105 from FIG. 1). Likewise, connection 112 may comprise a voltage node or rail (labeled as DC+(OUT)) and a reference node or rail (labeled as DC-(OUT)) coupled to a PCS (115 from FIG. 1). As will be discussed below, short-circuit current detection system 340 may monitor the current between these connection for excessive current and interrupt this connection for at least a period of time (e.g., momentarily in some instances, for a few minutes in other instances, indefinitely in yet other instances) prior to being reset in some manner (e.g., a local reset or a remote reset as discussed below).

As alluded to, the short-circuit current detection system 340 provides functionality for monitoring an interrupting current between connection 107 and connection 112 if a threshold transient current is detected. As such, the ASIC/PCB 230 includes indicator lights for a trip state 242 (indicating that an excessive current has been detected and that the connection between connection 107 and connection 112 has been interrupted) and ready state 243 (indicating that the connection between connection 107 and connection 112 remains). Further, the ASIC/PCB 230 includes input terminals/pads for local low-voltage power connection 250, a local reset pushbutton input 245, a local test pushbutton input 246, a remote trip state output 251, a remote reset input 252 and a remote open input 253. As the names indicate, the local power (250), local reset (245), and local test (246) pads may be electrically coupled to a local-control station having physical pushbutton inputs for actuating by an operator adjacent to the battery stacks 105 and the FCLD 110. Similarly, as the names also indicate, the remote reset (252), and remote trip indicator (251), and remote disconnect (253) pads may be electrically coupled to a remote-control station having physical pushbutton inputs for actuating by an operator remote from the battery stacks 105 and the FCLD 110. The various realizations of the functions of the FCLD 110 are discussed next with respect to FIG. 3.

Figure 3:
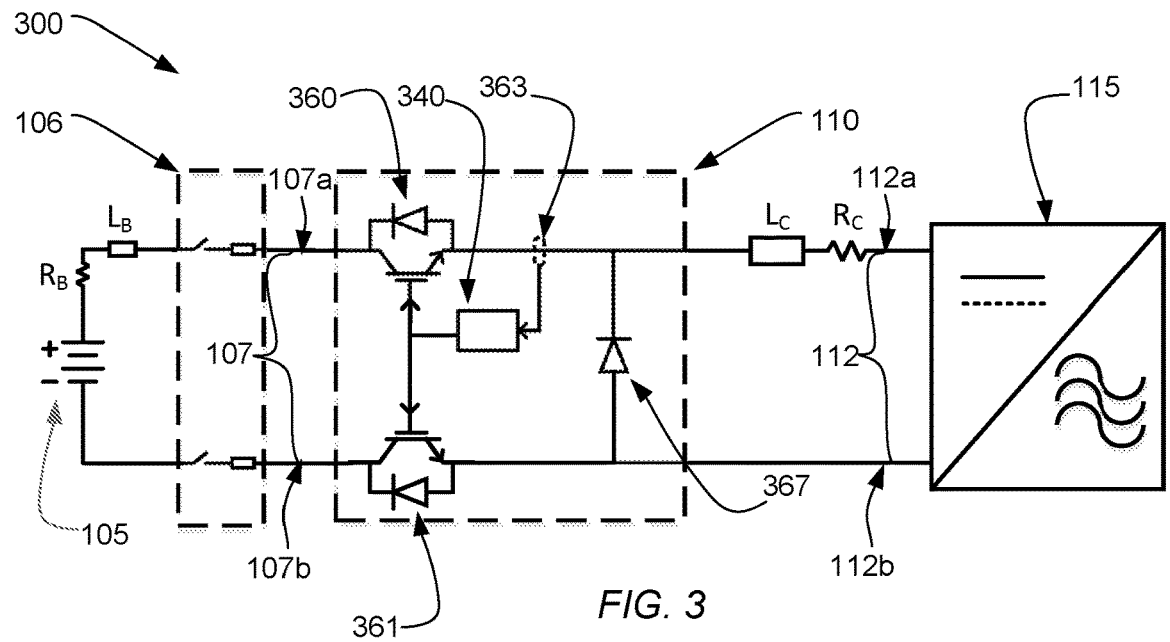
FIG. 3 is a circuit diagram of a fault current limiting circuit according to an embodiment of the subject matter disclosed herein.

FIG. 3 is a circuit diagram 300 of a system that includes the FCLD 110 of FIGS. 1 and 2 according to an embodiment of the subject matter disclosed herein. A skilled artisan understands that the circuit of FIG. 3 may be realized using solid-state electronic components disposed in an ASIC or PCB. Additionally, aspects of the circuit diagram may show components that are remote from the FCLD 110 so as to more easily illustrate the functionality and ingenuity of the embodiments described herein.

The circuit diagram 300 includes an electrical supply source, e.g., the battery 105 (shown here with a conductor line resistance RB and conductor line inductance LB) as well as the PCS 115 (shown here with a conductor line resistance Rc and conductor line inductance Lc). The electrical power source may also other forms of DC-source current supply such as solar panels, wind generators, or DC-based turbines. The input to the FCLD 110 is the afore-mentioned supply bus 107 (comprising a voltage rail 107$a$ and a reference rail 107$b$). Similarly, the PCS 115 is coupled to the output of the FCLD 110 via the afore-mentioned load bus 112 (comprising a voltage rail 112$a$ and a reference rail 112$b$). Furthermore, at the supply bus 107, there may typically be an additional physical disconnection means 106 for maintenance and install/removal procedures. That is, one may actuate the physical disconnects 106 to isolate the FCLD 110 from the power source (e.g., the battery 105).

Turning attention to the components of the FCLD 110, several options are available for realizing the functionality as discussed herein. In a first embodiment, first and second interruption switches 360/361 may be disposed at the voltage rail 107$a$ and the reference rail 107$b$ respectively. As shown in FIG. 3, each switch 360/361 may be an insulated-gate bipolar transistor (IGBT). These transistors are used as the means 360/361 of interruption for the voltage rail 107$a$ and the reference rail 107$b$, respectively. In this embodiment, the IGBT switches are shown as PNP-doped transistors such that a voltage present at the gate will result in an interruption in current flow through the transistor (e.g., the switch is open). In other embodiments (not shown), the transistors switches may be NPN-doped transistors such that a lack of voltage at the gate will result on an interruption of current flow through the transistor (e.g., the switch is open). In still further embodiments, the switches 360/361 may be a different type of semiconductor component, such as a Metal-Oxide Semiconductor Field-Effect Transistors (MOSFET) or a High-Electron Mobility Transistors (HEMT).

The afore-mentioned gate voltage at the switches 360/361 may be generated using a current sensor 363 that detects current flow through the voltage rail 107b. The current sensor 363 is used to sense the current passing through the device 110. This is, in turn, connected to a detection circuit 340 that will decide when to signal the switches 360/361 to interrupt the current. The detection circuit 340 may be a logic circuit suited to decipher the timing and nature of signals received from the current sensor 363. The timing and nature of the logical decisions within the detection circuit 340 is described further below and with respect to FIG. 4.

In this embodiment, the current sensor 363 may be a Hall effect sensor. The Hall effect sensor 363 is a transducer that varies its output voltage in response to the magnetic field created by the passing current in the node being monitored. Here the node being monitored is the input voltage rail 107b when coupled to the output voltage rail 112b. That is, the current sensor 363 is detecting current flowing from the battery stacks 105 to the PCS 115. Typically, an interruption within 6 microseconds is possible by using a Hall effect current sensor 363. Specific switching delays are discussed further below with respect to FIG. 4. Additionally, in embodiments suited for a large cable inductance Lc, a free-wheeling diode 367 allows the high-level, short-circuit current in the cable to dissipate safely (e.g., safely discharge the stored inductive energy after an interruption).

A fast-rising, short-circuit current (e.g., a transient current) can cause the IGBTs 360/361 to enter a de-saturation operation region thereby limiting the maximum short-circuit current to about 6 times a typical IGBT nominal current. These high-transient currents, typically caused by switching one or more battery stacks 105 into or out of service (e.g., connecting or disconnecting), may cause fault detection circuitry (downstream of the PCS 115 and not shown) to unnecessarily trip. That is, the fault detection circuitry may incorrectly interpret the high-transients currents that can be unique to systems having larger battery stacks as an actual short-circuit fault worthy of tripping the downstream protection circuitry. In order to prevent a false fault detection downstream, the fault current detection circuit 340 may use the voltage drop across the IGBT to detect and interrupt the current faster than 6 microseconds so that downstream fault protection circuitry is not tripped. Resetting a local interruption at the FCLD 110 is easier and quicker than dealing with more complicated fault protection circuitry designed to protect the entire electrical grid.

The embodiments described above that utilize a solid-state solution for bus coupling for larger numbers of battery stacks 105 that typically connect to a single PCS 115 provide the advantage of scalability because the FCLD 110 allows for a more inexpensive DC disconnect means. Because the FCLD 110 trips within about 6 microseconds, the transient current can be interrupted about 100 times faster than a common current limiting fuse. The specific timing and logical determination of the fault detection circuit 340 is discussed next with respect the method steps of FIG. 4.

Figure 4:
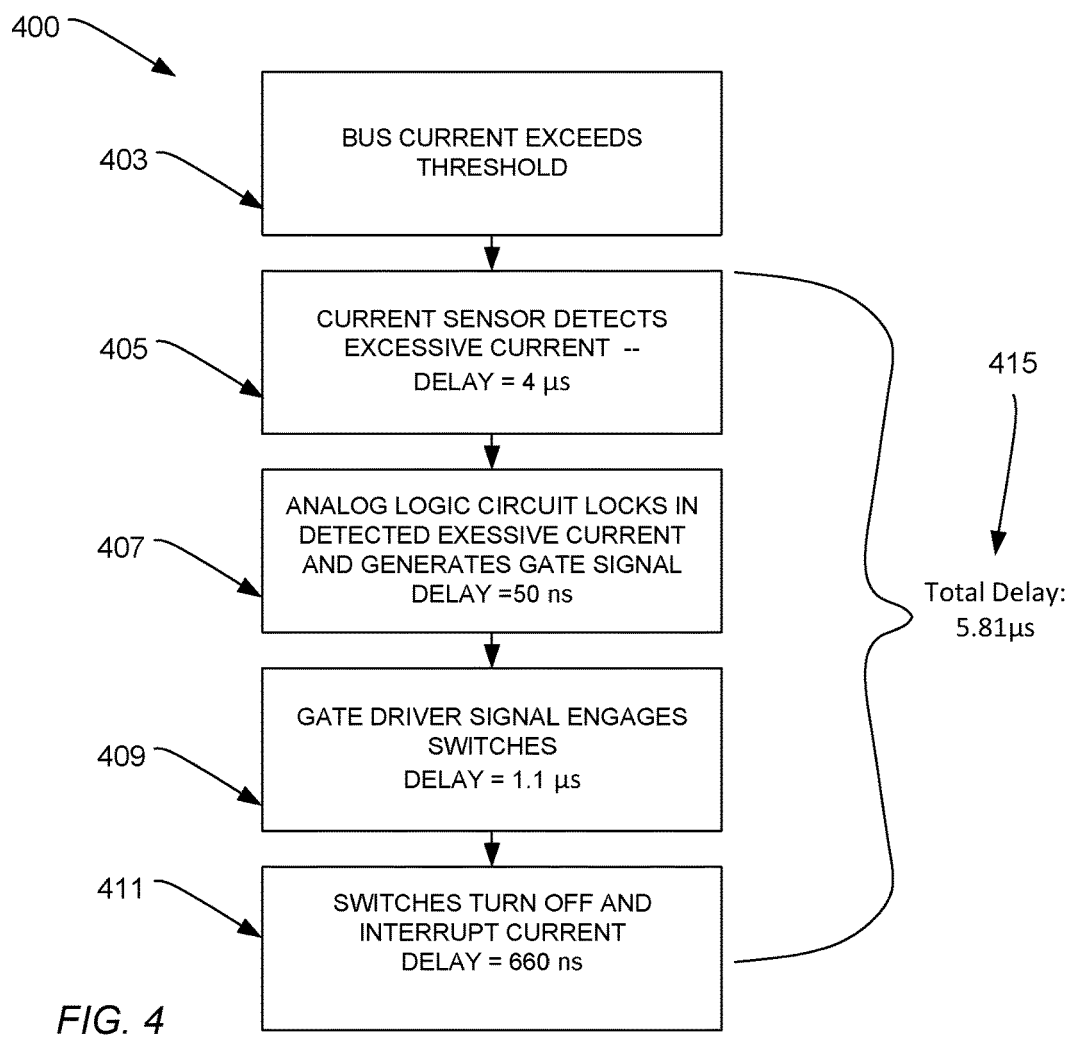
FIG. 4 is a flow diagram of a delays associated with stages of the fault current limiting device according to an embodiment of the subject matter disclosed herein.

FIG. 4 is a flow diagram 400 of steps taken during a fault detection and interruption using the FCLD 110 of FIGS. 1-3 according to an embodiment of the subject matter disclosed herein. In this flow diagram, one can also understand the delays associated with the steps in the method of the current fault limiting system. As was discussed above, a total delay 415 from detection of fault-current exceeding a threshold to interruption of the bus coupling should be no more than six microseconds. The FCLD 110 can achieve this as the propagation delays associated with detailed steps associated with the circuit stages collectively reach 5.81 microseconds.

The fault-current detection circuit 340 (FIG. 3) includes logic and analog circuitry for propagating a logic signal to the gates of the switches 360/361 when interruption is required. The method may begin at step 403 when a transient current is generated (e.g., from switching a battery stack 105 of FIG. 1) in or out of service. The transient current generated may or may not rise to the level (e.g., a threshold level) worthy of interruption with the FCLD 110. To this end, the threshold level current may be programmable and/or selectable by a system engineer prior to invoking operation. In this manner, the current sensor (363 of FIG. 3) may continuously detect current flowing through the voltage rail 107a/112a. At step 405, the current sensor may determine that the detected current flow exceeds the selected/programmed threshold. In doing so, the time required for identifying a current that exceeds said threshold is 4 microseconds (for a Hall effect sensor 363). Within the fault current detection circuit 340, additional analog logic circuitry (not shown separately) for "locking in" a detected current that exceeds the threshold takes 50 ns at step 407. As the detection is locked in, at step 409, a high-logic value (e.g., gate-driver logic) signal is placed at the gates of the switches 360/361 which includes a propagation delay of 1.1 microseconds. As the switches are then opened (e.g., the IGBT switches are turned off) the actual decay time for each IGBT 360/361 turnoff takes 660 ns at step 411. Thus, the total delay 415 is about 5.81 microseconds. Therefore, the fast-acting FCLD 110 will typically interrupt the fault current in the presence of any sizable transient current generated from switching battery stacks in and out, advantageously, prior to any downstream fault protection circuitry of the electrical grid beyond the PCS 115.

Although the disclosure includes a method, it is contemplated that it may be embodied as computer program instructions on a tangible computer-readable carrier, such as a magnetic or optical memory or a magnetic or optical disk. All structural, chemical, and functional equivalents to the elements of the above-described exemplary embodiments that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims.

Furthermore, no element, component, or method step in the present disclosure is intended to be dedicated to the public regardless of whether the element, component, or method step is explicitly recited in the claims. No claim element herein is to be construed under the provisions of 35 U.S.C. 112 (f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What has been described above includes examples of aspects of the claimed subject matter. It is, of course, not possible to describe every conceivable combination of components or methodologies for purposes of describing the claimed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has" or "having" are used in either the detailed description or the claims, such terms are intended to be inclusive in a manner similar to the term "comprising" as "comprising" is interpreted when employed as a transitional word in a claim.

Since many modifications, variations, and changes in detail can be made to the described preferred embodiments of the subject matter, it is intended that all matters in the foregoing description and shown in the accompanying drawings be interpreted as illustrative and not in a limiting sense. Thus, the scope of the subject matter should be determined by the appended claims and their legal equivalence.

What is claimed is:

1. An electrical device, comprising:
    an input voltage node configured to receive a first voltage signal from an energy source;
    an input reference node configured to receive a reference signal from the energy source;
    a first switch coupled between the input voltage node and an output voltage node;
    a second switch coupled between the input reference node and an output reference node; and
    a current sensor circuit coupled to the output voltage node and coupled respectively to the first switch and the second switch, the current sensor circuit configured to open the first and second switches in response to sensing a magnetic field caused by a current signal at the output voltage node that exceeds a threshold current, the opening within six microseconds of the sensing.

2. The electrical device of claim 1, further comprising a set of disconnects coupled respectively to the voltage input node and the input reference node and configured to disconnect the input voltage node from the first switch and disconnect the input reference node from the second switch irrespective of the current sensed by the current sensor circuit.

3. The electrical device of claim 1, wherein the current sensor circuit further comprises:
    a switch node coupled to the first and second switches;
    a Hall effect sensor disposed adjacent to the output voltage node; and
    a logic circuit coupled to the Hall effect sensor and configured to place a high-logic voltage on the switch node.

4. The electrical device of claim 1, further comprising a dissipation diode coupled between the output voltage node and the output reference node configured to dissipate inductive energy from the voltage node when the first and second switches are opened.

5. The electrical device of claim 1, wherein the first and second switches comprises one of the group composed of: a solid-state switch, an IGBT, a MOSFET, and an HEMT.

6. The electrical device of claim 1, wherein the current sensor circuit is configured to open the first and second switches simultaneously.

7. The electrical device of claim 1, wherein the current sensor circuit is configured to open the first and second switches within six microseconds of sensing the current signal at the output voltage node exceeding the threshold current.

8. The electrical device of claim 1, further comprising a fault detection circuit including:
    a detection node coupled to the current sensor and configured to receive a logic signal indicative of an excessive current;
    a lock-in circuit configured to lock in the logic signal; and
    an interruption signal driver circuit configured to generate a switch signal on the switch node in response to locking in the logic signal.

9. An electrical system, comprising:
    a plurality of energy sources, each having a first node coupled to a first DC voltage rail and each having a second node coupled to a reference rail;
    a fault current interruption circuit, including:
    a first switch coupled between the first node and a third node;
    a second switch coupled between the second node and a fourth node; and
    a current sensor circuit coupled to the third node and coupled respectively to the first switch and the second switch, the current sensor circuit configured to open the first and second switches in response to sensing a magnetic field caused by a current signal between the first node and the third node that exceeds a threshold current, the opening within six microseconds of the sensing; and
    a voltage inversion circuit coupled to the third node and the fourth node and configured to invert a DC voltage difference between the third node and the fourth node to an AC voltage.

10. The electrical system of claim 9, wherein the plurality of energy sources comprise a plurality of batteries coupled to a common voltage node and coupled to a common reference node.

11. The electrical system of claim 9, further comprising a set of disconnects coupled respectively to the first node and the second node and configured to disconnect the first node from the first switch and disconnect the second node from the second switch irrespective of the current sensed by the current sensor circuit.

12. The electrical system of claim 9, wherein the current sensor comprises a Hall effect sensor configured generate a logic signal indicative of excessive threshold in response to sensing a current signal at the third node that exceeds a threshold current.

13. The electrical system of claim 9, further comprising a load coupled to the voltage inversion circuit.

14. The electrical system of claim 9, further comprising an electrical grid coupled to the voltage inversion circuit.

15. The electrical system of claim 9, further comprising:
    a second plurality of energy sources, each having a fifth node coupled to a second DC voltage rail and each having a sixth node coupled to a second reference rail;
    a second fault current interruption circuit, including:
    a third switch coupled between the fifth node and the third node;
    a fourth switch coupled between the sixth node and a fourth node; and
    a second current sensor circuit coupled to the third node and coupled respectively to the third switch and the fourth switch, the second current sensor circuit configured to open the third and fourth switches in response to sensing a current signal between the fifth node and the third node that exceeds the threshold current.

16. The electrical system of claim 9, wherein the first and second switches comprises one of the group composed of: a solid-state switch, an IGBT, a MOSFET, and an HEMT.

17. A method of protecting an electrical system, comprising:
- detecting a magnetic field caused by an excessive transient current through a voltage rail coupled to an energy source;
- generating an interrupt signal at a fault detection circuit coupled to the voltage rail; and
- actuating an electronic switch on the voltage rail within six microseconds of the detecting.

18. The method of claim 17, further comprising actuating a second electronic switch on a reference rail coupled to the energy source simultaneous with the first electronic switch.

19. The method of claim 17, further comprising:
- locking in the detection of the excessive voltage with a logic circuit;
- generating a gate voltage signal on a gate node of the electronic switch to cause the actuation of the electronic switch; and
- dissipating an inductive voltage from the voltage rail after the actuating.

* * * * *